(12) United States Patent
Stojanovic et al.

(10) Patent No.: US 11,808,654 B2
(45) Date of Patent: Nov. 7, 2023

(54) INTEGRATED OPTICAL TRANSDUCER AND METHOD FOR DETECTING DYNAMIC PRESSURE CHANGES

(71) Applicant: ams International AG, Jona (CH)

(72) Inventors: Goran Stojanovic, Eindhoven (NL); Colin Steele, Eindhoven (NL); Jens Hofrichter, Eindhoven (NL); Catalin Lazar, Eindhoven (NL); Jochen Kraft, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 358 days.

(21) Appl. No.: 17/279,263

(22) PCT Filed: Sep. 17, 2019

(86) PCT No.: PCT/EP2019/074850
§ 371 (c)(1),
(2) Date: Mar. 24, 2021

(87) PCT Pub. No.: WO2020/064431
PCT Pub. Date: Apr. 2, 2020

(65) Prior Publication Data
US 2021/0404897 A1    Dec. 30, 2021

(30) Foreign Application Priority Data
Sep. 26, 2018  (EP) ..................... 18196899

(51) Int. Cl.
*G01L 9/00* (2006.01)
*B81B 7/02* (2006.01)
(Continued)

(52) U.S. Cl.
CPC .............. *G01L 9/0016* (2013.01); *B81B 7/02* (2013.01); *G02B 27/14* (2013.01); *H04R 23/008* (2013.01);
(Continued)

(58) Field of Classification Search
CPC ..................... H04R 23/008; H04R 2201/003
See application file for complete search history.

(56) References Cited

U.S. PATENT DOCUMENTS

| 4,422,167 A | 12/1983 | Shajenko |
| 5,262,884 A | 11/1993 | Buchholz |

(Continued)

FOREIGN PATENT DOCUMENTS

| CN | 1476629 A | 2/2004 |
| WO | 2006042696 A1 | 4/2006 |

OTHER PUBLICATIONS

Sun, Xi (CN Examiner), Chinese Search Report (with English Translation) in Chinese Application No. 2019800594091 dated Jul. 20, 2022, 5 pages.

(Continued)

*Primary Examiner* — Mark Fischer
(74) *Attorney, Agent, or Firm* — MH2 TECHNOLOGY LAW GROUP LLP

(57) ABSTRACT

An integrated optical transducer for detecting dynamic pressure changes comprises a micro-electro-mechanical system, MEMS, die having a MEMS diaphragm with a first side exposed to the dynamic pressure changes and a second side, and an application-specific integrated circuit, ASIC, die having an optical interferometer assembly. The interferometer assembly comprises a beam splitting element for receiving a source beam from a light source and for splitting the source beam into a probe beam in a first beam path and a reference beam in a second beam path, a beam combining (Continued)

element for combining the probe beam with the reference beam to a superposition beam, and a detector configured to generate an electronic interference signal depending on the superposition beam. The MEMS die is arranged with respect to the ASIC die such that a gap is formed between the second side of the diaphragm and the ASIC die, with the gap defining a cavity and having a gap height. The first beam path of the probe beam comprises coupling into the cavity, reflection off of a deflection point or a deflection surface (16) of the diaphragm and coupling out of the cavity.

18 Claims, 3 Drawing Sheets

(51) Int. Cl.
*G02B 27/14* (2006.01)
*H04R 23/00* (2006.01)

(52) U.S. Cl.
CPC . *B81B 2201/0264* (2013.01); *B81B 2201/047* (2013.01)

(56) References Cited

U.S. PATENT DOCUMENTS

| | | | |
|---|---|---|---|
| 6,014,239 | A | 1/2000 | Veligdan |
| 6,055,080 | A | 4/2000 | Furstenau et al. |
| 6,567,572 | B2 | 5/2003 | Degertekin et al. |
| 7,134,179 | B2 | 11/2006 | Freeman et al. |
| 9,274,283 | B1 | 3/2016 | Ellis-Monaghan et al. |
| 9,479,875 | B2 | 10/2016 | Hall et al. |
| 9,503,820 | B2 | 11/2016 | Hall et al. |
| 2007/0165896 | A1 | 7/2007 | Miles et al. |
| 2007/0215798 | A1* | 9/2007 | Kauppinen .......... H04R 23/008 250/231.1 |
| 2018/0095026 | A1 | 4/2018 | Prasad |
| 2018/0208454 | A1* | 7/2018 | Hoekstra .............. H04R 19/005 |
| 2019/0047847 | A1* | 2/2019 | Khenkin .............. H04R 19/005 |

OTHER PUBLICATIONS

International Search Report and Written Opinion in corresponding International Application No. PCT/EP2019/074850 dated Oct. 14, 2019, 10 pages.

\* cited by examiner

INTEGRATED OPTICAL TRANSDUCER AND METHOD FOR DETECTING DYNAMIC PRESSURE CHANGES

CROSS-REFERENCE TO RELATED APPLICATIONS

The present application is the national stage entry of International Patent Application No. PCT/EP2019/074850, filed on Sep. 17, 2019, which claims benefit of priority of European Patent Application No. 18196899.1 filed on Sep. 26, 2018, all of which are hereby incorporated by reference in their entirety for all purposes.

FIELD OF THE INVENTION

This disclosure relates to an integrated optical transducer for sensing dynamic pressure changes, in particular acoustic waves, and to a measurement method of dynamic pressure changes.

BACKGROUND OF THE INVENTION

Micro-electro-mechanical systems, MEMS, transducers for sensing dynamic pressure changes are used in a wide range of applications in modern consumer electronics, in particular as microphones for sensing pressure waves in the acoustic frequency band. Common examples in which highly integrated MEMS microphones play an important role are portable computing devices such as laptops, notebooks and tablet computers, but also portable communication devices like smartphones or smartwatches. While modern transducers commonly rely on a capacitive readout, which is sufficient for example for high-end audio applications, emerging applications such as voice recognition and deep learning applications require an increased signal-to-noise ratio, SNR, beyond the capabilities of present capacitive transducers.

SUMMARY

This disclosure provides an improved concept for a high-sensitivity, low-noise integrated transducer.

The improved concept is based on the idea of providing an integrated optical transducer that relies on interferometric readout of a displacement of a mechanically compliant transducer, such as a diaphragm, that is being influenced by dynamic pressure changes. A central aspect of the improved concept therein is the avoidance of a constraining back plate, which is required for capacitive readout schemes but also as a grating in conventional optical transducers.

For example, an integrated optical transducer for detecting dynamic pressure changes according to the improved concept comprises a MEMS die having a MEMS diaphragm with a first side exposed to the dynamic pressure changes and a second side. The transducer further comprises an application-specific integrated circuit, ASIC, die having an optical interferometer assembly.

The optical interferometer assembly comprises a beam-splitting element for receiving a source beam from a light source and for splitting the source beam into a probe beam in a first beam path and a reference beam in a second beam path. Moreover, the optical interferometer assembly further comprises a beam combining element for combining the probe beam with the reference beam to a superposition beam as well as a detector configured to receive the superposition beam and to generate an electronic interference signal depending on the superposition beam.

According to the improved concept, the MEMS die is arranged with respect to the ASIC die such that a gap is formed between the inner side of the diaphragm and the ASIC die, wherein the gap defines a cavity and is characterized by a gap height. The first beam path of the probe beam comprises coupling into the cavity, reflection off of a deflection point or a deflection surface of the diaphragm and coupling out of the cavity.

In such a transducer, the MEMS diaphragm of the MEMS die is for example a suspended membrane made of a material such as silicon nitride, crystalline-silicon or poly-silicon. The suspension is for example realized by mean of a clamping structure made of a material such as silicon. For being exposed to the dynamic pressure changes, the first side of the diaphragm is facing an environment of the transducer and may therefore be regarded as an outer side. On the contrary, the second side is facing the ASIC die and may therefore be regarded as an inner side.

The ASIC die may be fabricated separately from the MEMS die and may comprise active circuitry of an ASIC arranged on a substrate, such as a silicon substrate. The ASIC die further comprises optical elements necessary to realize the interferometric readout of a deflection of the MEMS diaphragm, such as conventional beam splitters for the splitting and combining of optical beams as well as a detector, such as a silicon photodiode, for optical analysis and generation of the interference signal.

To form the optical transducer, the two dies are arranged with respect to each other such that the cavity is created in between the MEMS diaphragm and the ASIC die, wherein the cavity is characterized by a gap with a certain gap height. For example, the MEMS die and the ASIC die are bonded together, for example following conventional wafer bonding techniques which may be of an adhesive or of a eutectic type.

The optical interferometer assembly forms an optical interferometer, such as a Mach-Zehnder or a Michelson interferometer, which relies on the probe beam impinging on a point or a surface on the diaphragm, e.g. a point or a surface on the second side, and being recombined with a reference beam from the same light source for creating the superposition beam. A length change of the first beam path, for example due to a deflection of the diaphragm induced by vibrations from dynamic pressure changes, causes a phase shift of the probe beam with respect to the reference beam in the second beam path. The resulting phase difference causes an interference pattern in the superposition beam, which may be detected and analyzed by means of the photodetector, providing information about the displacement of the diaphragm.

In some embodiments, the ASIC die further comprises the light source for emitting the source beam.

The light source may be a coherent light source such as a laser. On-chip solutions include integrated semiconductor lasers such as vertical-cavity surface-emitting lasers, VCSEL. These lasers may have small enough dimensions in order to be included in the ASIC of the transducer for supplying the source beam. This way, the transducer is able to operate independently without the requirement of an external light source.

In some embodiments, the first beam path deviates from the second beam path in terms of effective length by less than a coherent length of the light source.

In order for optical interferometers to create interference effects, such as interference patterns and fringes, the two arms of the interferometer, i.e. the first and the second beam paths, are required to equal in their effective path lengths up to the coherence length of the laser. Typically, the coherence length of a VCSEL is in the range between 1 mm and 10 cm, depending on the properties of the laser. Therefore, the transducer has to be designed in a way that this difference is maintained.

In some embodiments, the gap height is equal to or larger than 100 μm, in particular equal to or larger than 200 μm.

A large gap between the diaphragm and the AISC die mean a large back-volume of the transducer. This means that the transducer is characterized by a small acoustic impedance due to compression of air inside the back-volume, leading to a large sensitivity and SNR. In combination with an empty cavity, meaning no requirement of a perforated back plate as in conventional transducers, SNR of about 72 dBa to 80 dBa are achievable, satisfying the requirements of voice recognition and deep learning applications.

In some embodiments, the optical interferometer assembly further comprises a waveguide structure for guiding the reference beam, the probe beam and the superposition beam. The optical interferometer assembly further comprises at least one coupling element, such as a grating coupling element, for coupling light from the waveguide structure into the cavity and/or for coupling light from the cavity into the waveguide structure.

Waveguide structures, for example consisting of silicon-based waveguides, are a common means to guide light across a chip between optical elements. For example, the waveguide structure comprises different waveguides, wherein a first waveguide is configured to guide the source beam from the light source or a coupling element to the beam splitting element, for instance. A second and a third waveguide may be configured to guide the probe beam and the reference beam, respectively, and a fourth waveguide may be configured to guide the superposition beam from the beam combining element to the detector. As the probe beam traverses in the first beam path the cavity in free space, coupling elements may be employed for the waveguide-to-free-space coupling and vice versa. Typical examples for such coupling elements are grating coupling elements.

In some further embodiments, the beam splitting element and/or the beam combining element are integrated in the waveguide structure.

In order to keep the interferometer assembly simple and compact, as well as maintaining a high efficiency in terms of optical losses, waveguide-based beam splitters and combiners may be employed in order to generate the probe beam and the reference beam as well as the superposition beam.

In some further embodiments, the optical interferometer assembly further comprises in the first beam path a lens element, e.g. a multi-focal Fresnel lens element or an axicon lens element. The lens element is configured to receive the probe beam from the beam splitting element, create a modified probe beam with a modified spatial intensity profile and to couple the modified probe beam into the cavity, such that the probe beam is reflected off of multiple deflection points or one or more deflection surfaces of the diaphragm.

An optical transducer with such a lens element enables the probing of multiple points or an extended surface of the second side of the diaphragm, which results in larger sensitivity and SNR of the transducer. For example, the lens element is configured to provide the probe beam with a ring spatial intensity profile for impinging on, and therefore probing, an annular surface of the diaphragm. Suitable lenses include Fresnel lenses and axicon lenses, for example.

In some further embodiments, the coupling element is shaped according to the modified spatial intensity profile and is configured to couple the probe beam from the cavity to the waveguide structure.

For an efficient operation, the transducer is required to collect substantially all light reflected back from the second side of the diaphragm and to couple it back to the waveguide structure. This means for the coupling element to have a shape that corresponds to the intensity profile of the reflected probe beam. For example, if the reflected probe beam has a ring profile, the coupling element has a corresponding annular or circular shape with a dimension corresponding to a size, i.e. a diameter, of the reflected probe beam at the location of the coupling element.

In some embodiments, the optical interferometer assembly further comprises a phase adjusting element in the first beam path and/or in the second beam path.

Due to imperfections or tolerances during the fabrication process, actual dimensions of the finalized transducer may deviate from the design dimensions. For example, the gap height may vary by up to 5 μm and therefore end up smaller or larger than the intended value. To first order, the property of the interferometer compensates for any variation of the gap height. In addition, a fine trim of the optical path length helps to ensure an operation of the transducer in the preferred regime of the interferometer. For instance, this fine trim is realized by a thermal heating element in one of the beam paths for changing its effective length, for example by changing a property such as the refractive index of a waveguide.

In some embodiments, the second beam path comprises coupling into the cavity, reflection off of a stationary point or a stationary surface of the MEMS die and coupling out of the cavity.

In order to achieve substantially equal optical path lengths of the probe beam and the reference beam, the latter may likewise be guided through the cavity and impinge on a stationary point or a stationary surface of the MEMS die, such as a clamping structure of the diaphragm. The reflected reference beam is then recombined with the reflected probe beam in the beam combining element, for example, for creation of the superposition beam that carries the interference signal.

In some embodiments the optical interferometer assembly further comprises a further beam splitting element and a further beam combining element. The further beam splitting element is configured to generate a further probe beam in a third beam path and a further reference beam in a fourth beam path. The further beam combining element is configured to combine the further reference beam with the further probe beam to a further superposition beam.

In order to achieve higher sensitivity and SNR, the source beam is for example split into two parts, wherein each part is subsequently split into a probe beam and a reference beam. The two probe beams then may impinge on different points or surfaces of the diaphragm and therefore after reflection carry information of the deflection of multiple points. The two resulting superposition beams may be combined and analyzed by means of a single detector. Alternatively, the optical interferometer for example comprises an additional detector for detecting the further superposition beam.

In some embodiments, the third beam path comprises coupling into the cavity, reflection off of a further deflection point or a further deflection surface of the diaphragm and coupling out of the cavity.

In some further embodiments, the fourth beam path comprises coupling into the cavity, reflection off of a further stationary point or a further stationary surface of the MEMS die and coupling out of the cavity.

The object is further solved by an electronic device, such as an audio device or a communication device, comprising an integrated optical transducer according to one of the embodiments described above. The transducer is therein configured to omnidirectionally detect dynamic pressure changes in an environment of the transducer, for example dynamic pressure changes at rates corresponding to audio frequencies.

The object is further solved by a method for detecting dynamic pressure changes using an optical interferometer. The method comprises providing a MEMS diaphragm with a first side exposed to the dynamic pressure changes and a second side. The method further comprises splitting a source beam into a probe beam in a first beam path and a reference beam in a second beam path, reflecting the probe beam off of a deflection point or a deflection surface of the MEMS diaphragm, combining the probe beam and the reference beam into a superposition beam and generating an electronic interference signal depending on the superposition beam. Further embodiments of the method become apparent to the skilled reader from the embodiments of the transducer described above.

BRIEF DESCRIPTION OF THE DRAWINGS

The following description of figures of example embodiments may further illustrate and explain aspects of the improved concept. Components and parts of the transducer with the same structure and the same effect, respectively, appear with equivalent reference symbols. Insofar as components and parts of the transducer correspond to one another in terms of the function in different figures, the description thereof is not repeated for each of the following figures.

DETAILED DESCRIPTION

Figure 1:
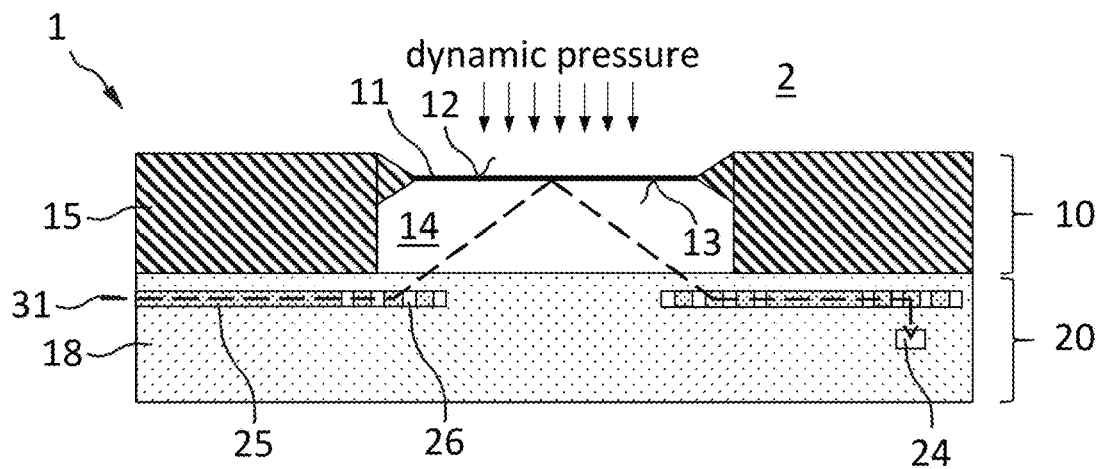
FIG. 1 shows a cross section view of an embodiment of the integrated optical transducer according to the improved concept.

FIG. 1 shows a cross section view of an embodiment of the integrated optical transducer 1 according to the improved concept. The transducer 1 comprises a MEMS die 10 and an ASIC die 20 that are for example in fused contact with each other after separate manufacturing processes. The fused contact is realized via standard wafer bonding techniques for instance. The two dies 10, 20 may be the only dies of the integrated optical transducer 1.

The MEMS die 10 comprises a MEMS diaphragm 11, which may be a suspended membrane made of a crystalline or polycrystalline material such as silicon or poly-silicon, a dielectric, or a metal. The diaphragm 11 comprises a first side 12 which is exposed to dynamic pressure changes such as acoustic waves in an environment 2 of the transducer 1. The diaphragm 11 further comprises a second side 13. A typical diameter for a diaphragm 11 configured to be sensitive to sound waves is in the order of 0.25 mm to 1.5 mm.

The suspension of the diaphragm 11 is realized through a suspension structure 15 which clamps the diaphragm 11 and may be made of a single material, e.g. a substrate material of the MEMS die such as silicon, or may comprise more than one material, for example the substrate material and a material of the diaphragm 11. The suspension structure 15 may further act as a bonding structure for bonding the MEMS die 10 to the ASIC die 20.

The MEMS die 20 is arranged with respect to the ASIC die 10 in such a fashion that a cavity 14 is formed, which is delineated by the second side 13 of the diaphragm 11, a surface of the ASIC die 20 and the suspension structure 15. The cavity 14 is characterized by the diameter of the diaphragm 11 and a gap height of a gap between the second side 13 of the diaphragm 11 and the surface of the ASIC die 20. The gap height is equal to or larger than 100 µm, in particular equal to or larger than 200 µm. Moreover, the cavity 14 is free from further elements such as a perforated back plate commonly found in conventional transducers.

The ASIC die 20 comprises an ASIC which is configured to detect a movement of the diaphragm 11, for example a periodical deflection due to an oscillation of the diaphragm 11. To this end, the ASIC die 20 comprises an optical interferometer assembly having a beam splitting element 21, a beam combining element 22 and a detector 24. The ASIC die 20 may further comprise a coherent light source 23 that emits a source beam 30, for example an infrared source beam with a wavelength of 980 nm. Alternatively, the optical interferometer assembly is configured to receive the source beam 30 from an external, i.e. a separate, light source 23.

The beam splitting element 21 is configured to receive the source beam 30 and to separate the source beam 30 into a probe beam 31 in a first beam path and a reference beam 32 in a second beam path. For illustration purposes, the reference beam path as well as the beam splitting element 21 and the beam combining element 22 are not shown. The two beam paths may comprise waveguides 25 for guiding of light beams and coupling elements 26 of a waveguide structure for coupling light between a waveguide 25 and the cavity 14. The waveguides 25 are for example buried channel waveguides integrated into a material of the ASIC die 20, such as a substrate material. The coupling elements 26 are for example high-efficiency grating coupling elements arranged at ends of the waveguides 25. High-efficiency coupling elements achieve coupling efficiencies in excess of 75% up to about 90%.

The probe beam is coupled into the cavity 14 and directed towards a deflection point or a deflection surface 16 on the second side 13 of the diaphragm 11, reflects off of the deflection point or the deflection surface 16 and after reflection is directed to a coupling element 26 for coupling into the waveguide 25. The deflection point or the deflection surface 16 are formed by a reflective coating on the second side 13 of the diaphragm 11, for example.

After combining the probe beam 31 and the reference beam 32 into the superposition beam 33, the latter is guided to a detector 24 on the ASIC die 20 for generating an electronic interference signal depending on interference patterns of the superposition beam 33.

Figure 2:
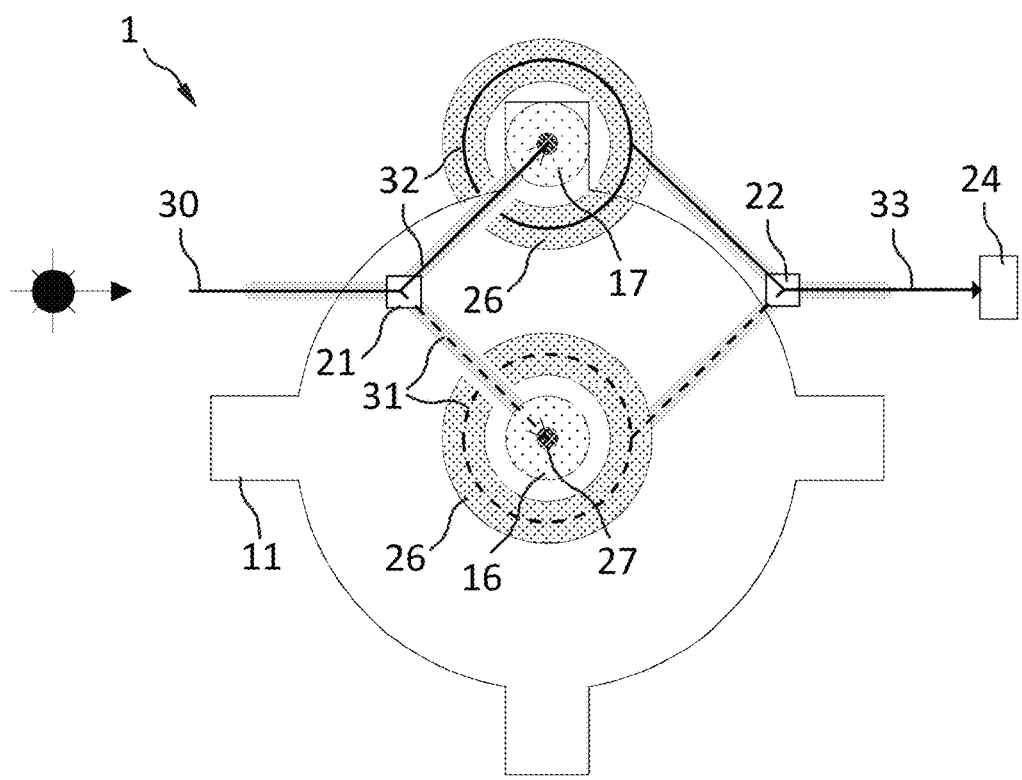
FIG. 2 shows a plan view of a further embodiment of the optical transducer.

FIG. 2 shows a plan view of a further embodiment of the optical transducer 1. The embodiment shows the beam splitting element 21, the beam combining element 22 as well as the beam paths of the source beam 30, the probe beam 31, the reference beam 32 and the superposition beam 33.

In this embodiment, the optical interferometer assembly further comprises lens elements 27 in the first and second beam path. The lens elements are for example Fresnel or axicon lens elements and configured to modify the spatial intensity profile of the probe beam 31 and the reference beam 32. The lens elements 27 may also act as coupling elements for coupling the probe beam 31 and the reference beam 32 to the cavity 14. For example, the modified probe beam 31 and reference beam 32 have a circular or an annular intensity profile and are defocused onto the deflection point or deflection surface 16 and onto the stationary point or stationary surface 17 of the diaphragm 11, respectively. The deflection point or deflection surface 16 is located at or close to the center of the second side 13 of the diaphragm 11, while the stationary point or stationary surface 17 is located at or close to the suspension structure 15, for instance.

The coupling elements 26 for coupling the probe beam 31 and the modified reference beam 32 from the cavity 14 into waveguides 25 correspond to the spatial intensity profile of the respective beam in terms of shape and size. For example, the coupling elements 26 are of annular shape. The probe beam 31 and the reference beam 32 are subsequently combined by the beam combining element 22 to form the superposition beam, which is directed to the detector 24, for example a silicon-based photodiode.

Figure 3:
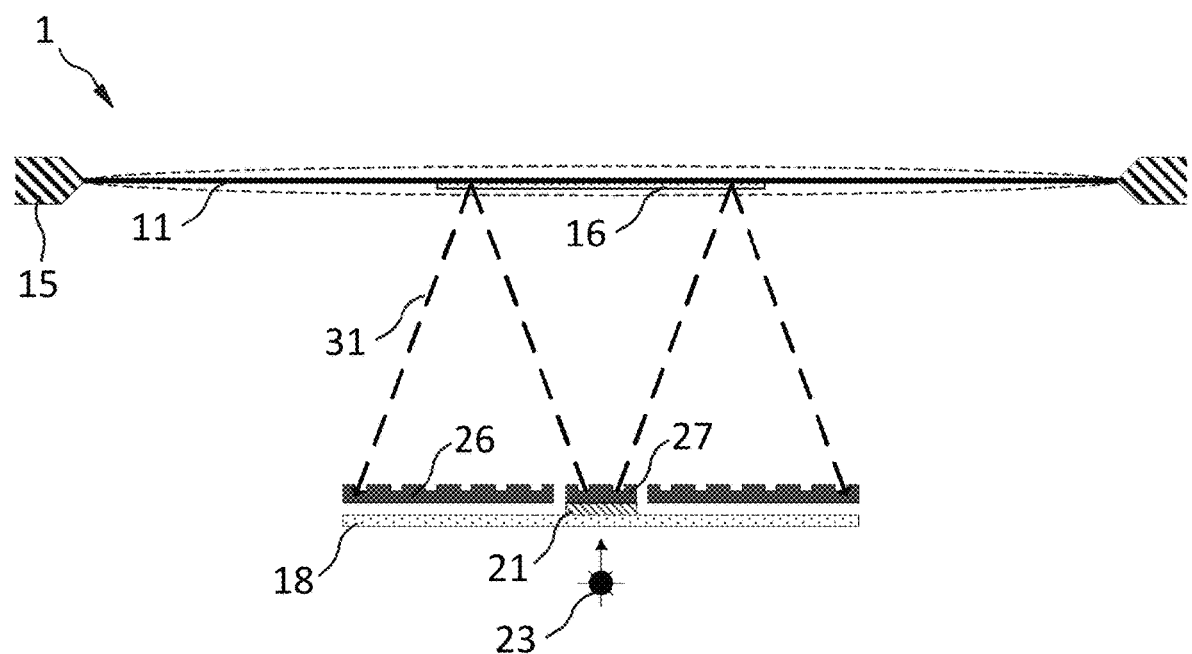
FIG. 3 shows a cross section view of a further embodiment of the optical transducer.

FIG. 3 shows a cross section view of an embodiment of the optical transducer 1, which is based on the embodiment shown in FIG. 2. FIG. 3 illustrates the working principle of the lens element 27, which modifies the intensity profile of the probe beam 31 to an annular shape, and the likewise annular coupling element 26 for coupling the reflected probe beam 31 into a waveguide 25 of the waveguide structure. The dashed line marks the path of the probe beam 31 after being split from the source beam 30 by the beam splitting element 21. A defocusing angle of the probe beam 31 defined by the lens element may be between 5 and 25°

Contrary to the embodiment shown in FIG. 2, the reference beam 32 may alternatively not be coupled into the cavity 14, but instead remain within the waveguide structure of the ASIC die 20 before being recombined with the probe beam 31. For illustration purposes, the second beam path of the reference beam 32 is not shown in this embodiment.

In this embodiment, the beam splitting element 21 is backside illuminated, for example via a coherent light source 23 emitting the source beam 30 and guiding it through waveguides 25 or a transparent material 18 of the ASIC die 20.

Figure 4:
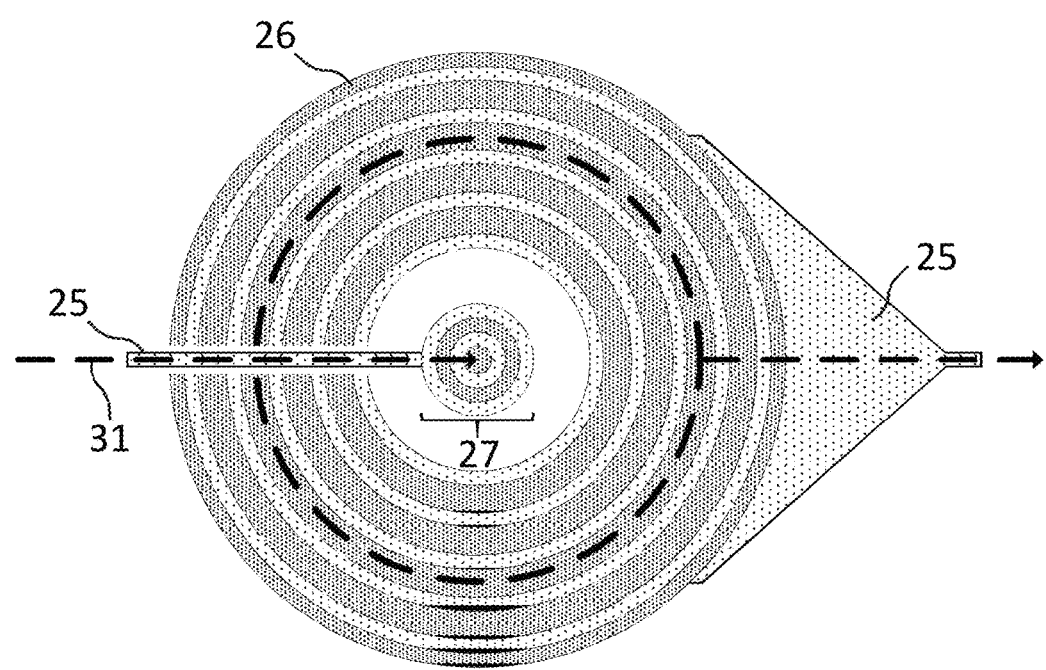
FIG. 4 shows a plan view of a further embodiment of the optical transducer.

FIG. 4 shows a plan view of the waveguide structure of the embodiment of the integrated transducer 1 shown in FIG. 2. The probe beam 31 is guided towards the lens element 27 by means of a waveguide 25. After reflection off of the second side 13 of the diaphragm 11, the probe beam 31 with its for example annular intensity profile is directed to the coupling element 26, e.g. a grating coupling element, which couples the reflected probe beam into a waveguide 25 directing the light towards the beam combining element 22.

Figure 5:
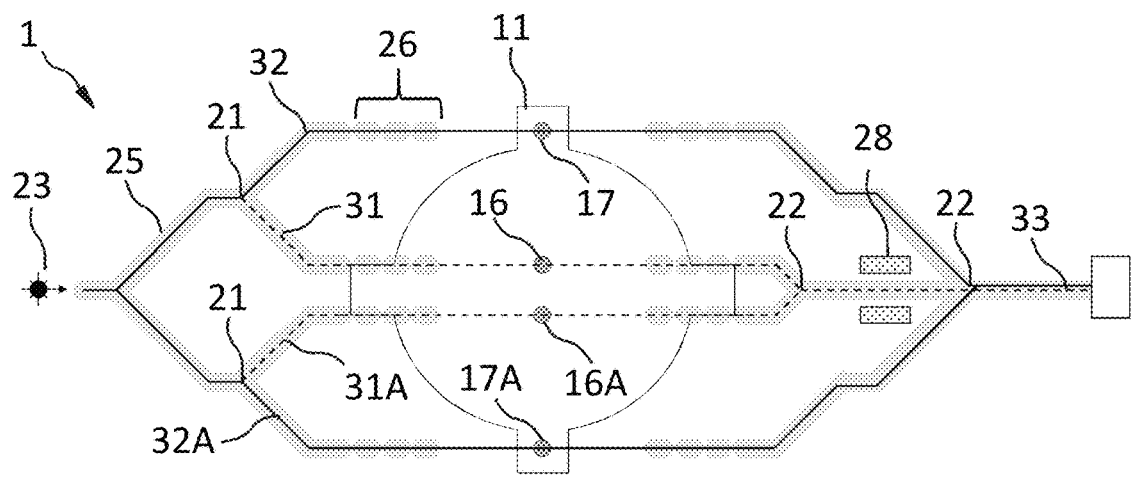
FIG. 5 shows a plan view of a further embodiment of the optical transducer.

FIG. 5 shows a plan view of a further embodiment of the optical transducer. This embodiment is based on the idea of measuring a deflection of the diaphragm in multiple points. To this end, the source beam 30 is split into two probe beams 31, 31A and two reference beams 32, 32A using further beam splitting elements 21. The probe beams 31, 31A are coupled into the cavity 14 by means of grating coupling elements 26 arranged at the end of waveguides 25 and reflected off of two distinct deflection points or deflection surfaces 16, 16A on the second side 13 of the diaphragm 11. Likewise, the reference beams 32, 32A are reflected off of two distinct stationary points or stationary surfaces 17, 17A. In this embodiment, the probe beams 31, 31A and the reference beams 32, 32A are combined into one superposition beam 33, which is directed to the detector 24.

Furthermore, the ASIC die 20 of the embodiment shown comprises in the optical interferometer assembly a phase adjusting element 28, for example a thermo-optical refractive index modulator configured to adjust the refractive index of the waveguide 25. With this element, the optical path length of the probe beam path may be adjusted to match the optical path length of the reference beam path such that the optical interferometer operates in the preferred regime. This fine tune is capable of compensating differences due to fabrication tolerances, which typically are in the order of several μm.

Figure 6:
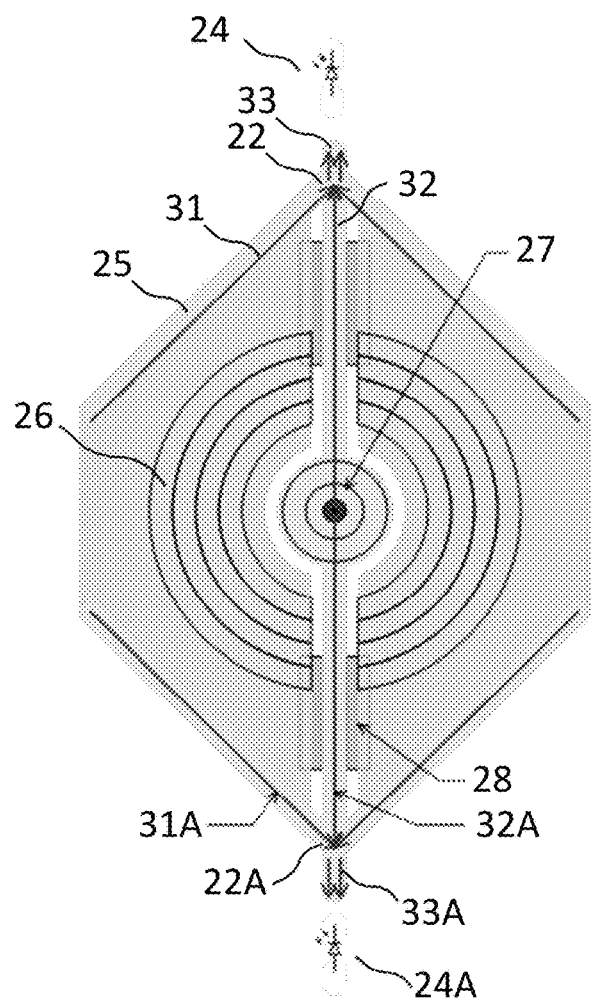
FIG. 6 shows a plan view of a further embodiment of the optical transducer.

FIG. 6 shows an embodiment of the waveguide structure similar to that shown in FIG. 4. In contrast to FIG. 4, however, the source beam is split into two reference beams 32, 32A and each is guided to one of two distinct beam combining elements 22, 22A. The coupling element 26 in this embodiment receives the reflected probe light from the cavity 14 and couples it into the waveguide 25, which splits the reflected light into two probe beams 31, 31A, which are each likewise guided to one of the two distinct beam combining elements 22, 22A for generating two superposition beams 33, 33A. Each of the superposition beams 33, 33A is directed to a distinct detector 24, 24A for analysis of the interference pattern. The electronic interference signal for example depends on the detection signals from the two detectors 24, 24A.

The embodiments shown in the FIGS. 1 to 6 as stated represent exemplary embodiments of the integrated optical transducer 1, therefore they do not constitute a complete list of all embodiments according to the improved concept. Actual transducer configurations may vary from the embodiments shown in terms of shape, size and materials, for example.

A transducer 1 according to one of the embodiments shown may be conveniently employed in various applications that require a compact high-sensitivity transducer for detecting small dynamic pressure changes, particularly in the audio band for the detection of sound waves. Possible applications include an employment as an acoustic microphone for voice recognition and deep learning purposes in computing devices such as laptops, notebooks and tablet computers, but also in portable communication devices like smartphones and smart watches, in which space for additional components is extremely limited.

The invention claimed is:

1. An integrated optical transducer for detecting dynamic pressure changes, the transducer comprising:
    a micro-electro-mechanical system, MEMS, die having a MEMS diaphragm with a first side exposed to the dynamic pressure changes and a second side; and
    an application-specific integrated circuit, ASIC, die having an optical interferometer assembly comprising:
        a beam splitting element for receiving a source beam from a light source and for splitting the source beam into a probe beam in a first beam path and a reference beam in a second beam path;
        a beam combining element for combining the probe beam with the reference beam to a superposition beam; and a detector configured to receive the superposition beam and to generate an electronic interference signal depending on the superposition beam;

wherein the MEMS die is arranged with respect to the ASIC die such that a gap is formed between the second side of the diaphragm and the ASIC die, with the gap defining a cavity and having a gap height; and the first beam path of the probe beam comprises coupling into the cavity, reflection off of a deflection point or a deflection surface of the diaphragm and coupling out of the cavity.

2. The integrated optical transducer according to claim 1, wherein the ASIC die further comprises the light source for emitting the source beam.

3. The integrated optical transducer according to claim 1, wherein the first beam path deviates from the second beam path in terms of effective length by less than a coherence length of the light source.

4. The integrated optical transducer according to claim 1, wherein the gap height is equal to or larger than 100 µm, in particular equal to or larger than 200 µm.

5. The integrated optical transducer according to claim 1, wherein the optical interferometer assembly further comprises a waveguide structure for guiding the probe beam, the reference beam and the superposition beam; and at least one coupling element, such as a grating coupling element, for coupling light from the waveguide structure into the cavity and/or for coupling light from the cavity into the waveguide structure.

6. The integrated optical transducer according to claim 5, wherein the beam splitting element and/or the beam combining element are integrated in the waveguide structure.

7. The integrated optical transducer according to claim 5, wherein the optical interferometer assembly further comprises in the first beam path a lens element, in particular a multi-focal Fresnel lens element or an axicon lens element, wherein the lens element is configured to receive the probe beam from the beam splitting element;

create a modified probe beam with a modified spatial intensity profile; and couple the modified probe beam into the cavity such that the probe beam is reflected off of multiple deflection points or one or more deflection surfaces of the diaphragm.

8. The integrated optical transducer according to claim 7, wherein the coupling element is shaped according to the modified spatial intensity profile and is configured to couple the probe beam from the cavity into the waveguide structure.

9. The integrated optical transducer according to claim 7, wherein the lens element is a multi-focal Fresnel lens element or an axicon lens element.

10. The integrated optical transducer according to claim 1, wherein the optical interferometer assembly further comprises a phase adjusting element in the first beam path and/or in the second beam path.

11. The integrated optical transducer according to claim 1, wherein the second beam path comprises coupling into the cavity, reflection off of a stationary point or a stationary surface of the MEMS die and coupling out of the cavity.

12. The integrated optical transducer according to claim 1, wherein the optical interferometer assembly further comprises a further beam splitting element and a further beam combining element, wherein the further beam splitting element is configured to generate a further probe beam in a third beam path and a further reference beam in a fourth beam path; and the further beam combining element is configured to combine the further reference beam with the further probe beam to a further superposition beam.

13. The integrated optical transducer according to claim 12, wherein the third beam path comprises coupling into the cavity, reflection off of a further deflection point or a further deflection surface of the diaphragm and coupling out of the cavity.

14. The integrated optical transducer according to claim 12, wherein the fourth beam path comprises coupling into the cavity, reflection off of a further stationary point or a further stationary surface of the MEMS die and coupling out of the cavity.

15. An electronic device, such as an audio device or a communication device, comprising an integrated optical transducer according to claim 1, wherein the transducer is configured to omnidirectionally detect dynamic pressure changes in an environment of the transducer, in particular dynamic pressure changes at rates corresponding to audio frequencies.

16. The electronic device according to claim 15, wherein the transducer is configured to omnidirectionally detect dynamic pressure changes at rates corresponding to audio frequencies.

17. A method for detecting dynamic pressure changes using an integrated optical transducer according to claim 1, the method comprising providing the MEMS diaphragm with the first side exposed to the dynamic pressure changes and the second side;

splitting the source beam into the probe beam in the first beam path and the reference beam in the second beam path;

reflecting the probe beam off of the deflection point or the deflection surface of the MEMS diaphragm;

combining the probe beam and the reference beam into the superposition beam; and generating the electronic interference signal depending on the superposition beam.

18. The integrated optical transducer according to claim 1, wherein the gap height is equal to or larger than 200 µm.

* * * * *